(12) United States Patent
Kohno

(10) Patent No.: US 6,396,150 B2
(45) Date of Patent: May 28, 2002

(54) WIRING STRUCTURE OF SEMICONDUCTOR DEVICE

(75) Inventor: Takaki Kohno, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/864,255

(22) Filed: May 25, 2001

(30) Foreign Application Priority Data

Jun. 2, 2000 (JP) .......................................... 2000-166316

(51) Int. Cl.[7] .................... H01L 23/48; H01L 23/52; H01L 29/40
(52) U.S. Cl. ......................... 257/758; 365/53; 438/622
(58) Field of Search ............................ 257/758; 365/53, 365/102, 149

(56) References Cited

U.S. PATENT DOCUMENTS 6,285,573 B1 * 9/2001 Park ............................ 365/53

* cited by examiner

Primary Examiner—David Nelms
Assistant Examiner—Andy Huynh
(74) Attorney, Agent, or Firm—Sughrue Mion, PLLC

(57) ABSTRACT

A method is provided for wiring semiconductor integrated circuits which produces a shielding effect while increasing the wiring area to a small extent. On one side of each of a plurality signal wires, a shielding wire made of the same material and having the same length as the signal wire is provided. The shielding wires are set to the ground potential via aluminum wiring extended from GND pads. Shielding wire segments are separated by cranking points.

20 Claims, 17 Drawing Sheets

TABLE OF TOTAL WIRING AREA AND SHIELDING RATE (APPROXIMATE EXPRESSION)

| | NUMBER OF SIGNAL WIRING LINES | NUMBER OF SHIELDING WIRING LINES | SHIELDING WIRING LENGTH (PER ONE SIGNAL WIRING LINE) | ADDED WIRING AREA | TOTAL WIRING AREA | SHIELDING RATE (*100%) |
|---|---|---|---|---|---|---|
| EMBODIMENT 1 | N | N/2+1 | L | - | 3N-2+1 | L/L |
| EMBODIMENT 2 | N | N-1 | 4L/N | 2 | N+2 | (4L/N)/L=4/N |
| EMBODIMENT 3 | N | N+1 | 4L/N | 2 | N+2 | 4/N |
| EMBODIMENT 4 | N | N+1 | 4L/N | 4 | N+4 | 4/N |
| EMBODIMENT 5 | N | N+1 | 4L/N | 4 | N+4 | 4/N |
| EMBODIMENT 6 | N | N-1 | 6L/N | 3 | N+3 | (6L/N)/L=6/N |
| EXAMPLE OF BACKGROUND 1 | N | 0 | 0 | - | N | 0 |
| EXAMPLE OF BACKGROUND 2 | N | N+1 | 2L | - | 2N+1 | 2L/L=2 |
| EXAMPLE OF BACKGROUND 3 | N | N-1 | 2L | - | 2N-1 | 2 |

Fig.18

TABLE OF TOTAL WIRING AREA AND SHIELDING RATE (NUMERICAL VALUES)

| | SHIELDING RATE (*100%) | | TOTAL WIRING AREA | |
|---|---|---|---|---|
| | N=4 | N=10 | N=4 | N=10 |
| EMBODIMENT 1 | 1 | 1 | 7 | 16 |
| EMBODIMENT 2 | 1 | 0.4 | 6 | 12 |
| EMBODIMENT 6 | 1.5 | 0.6 | 7 | 13 |
| EXAMPLE 1 OF BACKGROUND | 0 | 0 | 4 | 10 |
| EXAMPLE 2 OF BACKGROUND | 2 | 2 | 9 | 21 |
| EXAMPLE 2-2 OF BACKGROUND | 2 | 2 | 7 | 19 |

NOTE: SHIELDING RATE WAS OBTAINED BY EXCLUDING OUTERMOST WIRING LINES.

WIRING STRUCTURE OF SEMICONDUCTOR DEVICE

BACKGROUND OF THE INVENTION

1. Field of the Invention

The present invention relates to a wiring structure for semiconductor integrated circuits. The present application is based on Japanese Patent Application No. 166316/2000, which is incorporated herein by reference.

2. Background

In a semiconductor device of which high-speed operation is required, a speedup effect of signal wires is also required. However, as is well known, it is important to take measures against a reduction in operating speed in a situation where capacitive coupling occurs between adjacent signal wiring conductors and, in particular, signals in phase opposition to each other flow through adjacent signal wires (hereinafter referred to as crosstalk noise).

A wiring structure for semiconductor integrated circuits will be described with reference to drawings.

FIG. 1 is a wiring layout diagram of Example 1 of the background (using no anti-crosstalk noise measure). Signal wires S1 to S4 are used for output signals from an address buffer or the like and are formed by aluminum wiring. Ordinarily, to increase the degree of integration, signal wires S1 to S4 are formed and arranged so as to minimize their width and the spacing therebetween.

Here, crosstalk noise will be described briefly with reference to FIG. 2 (an equivalent circuit diagram corresponding to the signal wiring in FIG. 1) and FIG. 2 (an F1-F1D cross-sectional view of the signal wire in FIG. 1).

Referring to FIG. 2, well-known inverters INV perform inverting amplification to transfer a change in voltage at an input node to an output node through signal wires S1 to S3. The signal wires S1 to S3 have parasitic resistances and parasitic capacitances. Let each resistance be R. Let the capacitance between each adjacent pair of the signal wires be C1, and the capacitance between each signal wire and the base plate (substrate) (hereinafter referred to as "on-substrate capacitance") be C2. The existence of two kinds of capacitances C1 and C2 is apparent from the cross-sectional view in FIG. 3.

The value of C1 and the voltage have direct influence on crosstalk noise.

In general, a delay time ascribable to wiring is expressed by the following equation:

$$t = -C \cdot R \cdot \ln(V'/V) \quad \text{(Equation A)}$$

where t is a delay time, C is a capacitance value, R is a resistance value, V' is a voltage value, V is a voltage value (initial value), and ln is a symbol denoting a natural logarithm.

As is apparent from this equation, the delay time is shorter if the capacitance value is smaller.

However, the capacitance value C1 also changes transiently according to the states on the adjacent signal wires (S1 and S2 in this case), and it is difficult to express t only by Equation (A).

When transitions are made on the signal wires S1 and S3 in phase opposition to a transition on the signal wire S2, the capacitance value is effectively maximized.

As a result of a simple speed simulation, it has been confirmed that the delay time when transitions are made on the signal wires S1 and S3 in phase opposition to a transition on the signal wire S2 is 67% longer than the delay time when the potential of each of the signal wires S1 and S3 is fixed at the ground (hereinafter referred to as GND) potential.

Example 2 of the background is an example of a solution of such a problem of Example 1 of the background.

FIG. 4 is a wiring layout diagram of Example 2 of the conventional art (using an anti-crosstalk noise measure). In this example, as shown in FIG. 4, shielding wires D1 to D5 made of the same material and having the same length as the signal wiring conductors S1 to S4 are formed on opposite sides (left and right sides as viewed in the diagram) of each of the signal wiring conductors S1 to S4, and have their potentials fixed at the GND potential. That is, signal wires, shielding wires whose potential is fixed at the GND potential and signal wires of the same structure as the shielding wires are alternately arranged. The GND potential is supplied to the shielding wires from GND pads via aluminum wiring, which is not illustrated.

A description will then be made with reference to FIG. 5 (an F2-F2D cross-sectional view of the signal wire in FIG. 4) and FIG. 6 (a diagram formed by simplifying FIG. 5).

In FIG. 5, C3 represents the capacitance between each of the adjacent signal wire-shielding wire pair, C4 represents the capacitance between each adjacent pair of the signal wires, and C5 and C6 represent on-substrate capacitances.

Then, referring to FIG. 6 which is simplified by considering only the signal wires (the components indicated by the same reference characters in FIGS. 5 and 6 are common components), C3 in the wiring capacitance is expressed as an on substrate capacitance in C3+C5, and C4 is shown in the same manner as in FIG. 5. Ordinarily, C4 is a value much smaller than C3+C5 and can be ignored. As can be understood from the Equation (C) shown above, there is substantially no delay time since C4 can be ignored.

That is, the shielding wire enables high-speed operation through each of the signal wires without influence of changes in voltage on the adjacent signal wires.

Example 1 (FIG. 3) and Example 2 (FIG. 6) of the conventional art will be again referred to and compared.

Since C2 and C3+C5 are substantially equal, it is thought that a cause of occurrence of a significant difference between the delay times depends on the relationship between values of C1 and C4.

It is then assumed that the relationship between the values of C1 and C4 can be represented by the existence/nonexistence of shielding wire and the effect of shielding wire (hereinafter referred to as "shielding ratio") calculated by a simple proportion calculation as shown by the following Equation (B) using the shielding wire length.

$$\text{Shielding Rate} = (\text{Shielding Wire Length/Signal Wire Length}) \times 100(\%) \quad \text{(Equation B)}$$

FIG. 7 shows a delay time-shielding rate dependence.

In Example 1 of the background, there is no shielding wire and the shielding rate is expressed as 0.

In Example 2 of the background, each of the signal wire length and the shielding wire length is L and the shielding rate=2L/L×100 200% is expressed. The reason for setting the shielding wire length to 2L in obtaining this shielding rate is because shielding wires are provided on the opposite sides of each signal wire (left and right sides as viewed in FIG. 4).

It can be understood from FIG. 7 that if the shielding rate is higher, the delay time is shorter.

In the wiring structure of Example 2, however, if the number of signal wires is n, the wiring area=2n+1 (in the case where shielding wires are provided at the outermost ends) or 2n−1 (in the case where no shielding wires are provided at the outermost ends (Example 2 of the background). The wiring area is roughly doubled. Therefore, this method is not suitable for wiring layouts for semiconductor devices of which a high degree of integration is required.

If there is need for a solution optimized in terms of both high-speed performance and degree of integration, an intermediate characteristic between those in Examples 1 and 2 of the background may be required.

It is, therefore, an object of the present invention to provide a wiring method for semiconductor integrated circuits which produces a shielding effect by increasing the wiring area.

SUMMARY OF THE INVENTION

In one embodiment of the present invention of a wiring structure for a semiconductor integrated circuit, a shielding wire having the same length as the signal wire and having the ground potential is provided on one of the opposite sides of each of a plurality of signal wires.

In addition, in another embodiment of the present invention of a wiring structure for a semiconductor integrated circuit, a signal wire is bent at a cranking manner, and a shielding wire has the ground potential in an wiring area defined adjacent to the signal wire.

In this case, it is preferred that the shielding wire is formed by being bent according to the cranked portion of the signal wire.

Further, in the invention in each of the two included embodiments, it is preferred that, on a layer in which the signal wire and the shielding wire are formed, a second shielding wire be provided in correspondence with the signal wire, and that the second shielding wire and the shielding wire be connected via a through-hole.

It is also preferred that the ground potential is supplied to the shielding wire via contact from a base plate for the semiconductor integrated circuit.

BRIEF DESCRIPTION OF THE DRAWINGS

The above and other objects, advantages and features of the present invention will be more apparent from the following description taken in conjunction with the accompanying drawings, in which:

FIG. 18 is a table of the total wiring area and the shielding rate (approximate expression) for comparison between the examples of the background and the embodiments of the present invention.

FIG. 19 is a table of total wiring area and the shielding rate (numerical values) for comparison between the examples of the background and the embodiments of the present invention.

BRIEF DESCRIPTION OF THE PREFERRED EMBODIMENTS

Embodiments of the present invention will be described with reference to the drawings. In particular various shielding methods will be described with respect to a case where four signal wires (S1 to S4) are provided. It is understood that the invention is not limited to this embodiment, which is provided as only one example of an implementation of the invention.

(Embodiment 1)

Figure 8:
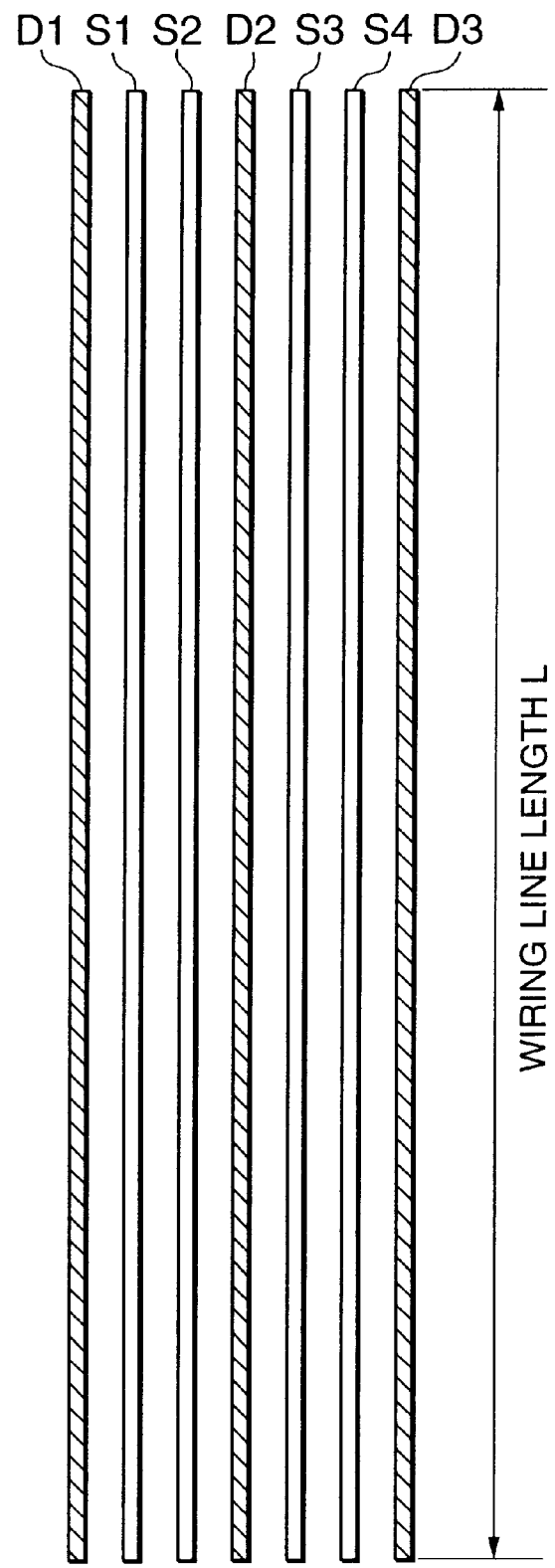
FIG. 8 is a wiring layout diagram of a semiconductor integrated circuit in Embodiment 1 of the present invention.

FIG. 8 is a wiring layout diagram of a semiconductor integrated circuit in Embodiment 1 of the present invention. In Embodiment 1, as shown in FIG. 8, shielding wires D1 to D3, made of the same material and having the same length as the signal wiring conductors S1 to S4, are provided on either the left or right side of each signal wire S1 to S4. Therefore, signal wires S1 and S2 are adjacent to one another (i.e. there are no intervening wires). Similarly, signal wires S3 and S4 are also adjacent. The shielding wires (D1 to D3) have their potentials set to the GND potential. In this embodiment, aluminum wiring may be expended from GND pads for setting the shielding wire potential to the GND potential, as in Example 2 of the background.

The effect of shielding wire (hereinafter referred to as "shielding rate") is expressed by using the shielding rate in the Equation (A) shown above. In this embodiment, since both the length of the signal wires and shielding wires are L, an approximate expression for the shielding rate can be represented by the following equation from Equation (B):

$$\text{Shielding Rate} = (L/L) \times 100. \qquad \text{(Equation B-1)}$$

On the other hand, the total number of signal wires can be regarded as the degree of integration (wiring area), and the wiring area can be shown by the following Equation (C):

$$\text{Wiring Area} = \text{Number of Signal wires} + \alpha. \qquad \text{(Equation C)}$$

In this equation, α (alpha) varies depending on the wiring layout and represents the area necessary for shielding wire in terms of number of signal wires.

In this embodiment, if the number of signal wires is n, α=n/2+1. Accordingly, $$\text{Wiring Area} = n + \alpha = n + n/2 + 1 = 3n/2 + 1. \quad \text{(Equation C-1)}$$

Since the number of signal wires is 4, n=4 is substituted in Equation (C-1) to obtain a wiring area=7.

As described above, this embodiment is improved in shielding effect in comparison with example 1 of the background (the shielding rate in Example 1 of the background is 0%), and is improved in the degree of integration in comparison with Example 2 of the background (the wiring area in Example 2 of the background is 9), thus enabling control of the shielding effect and degree of integration.

Figure 9:
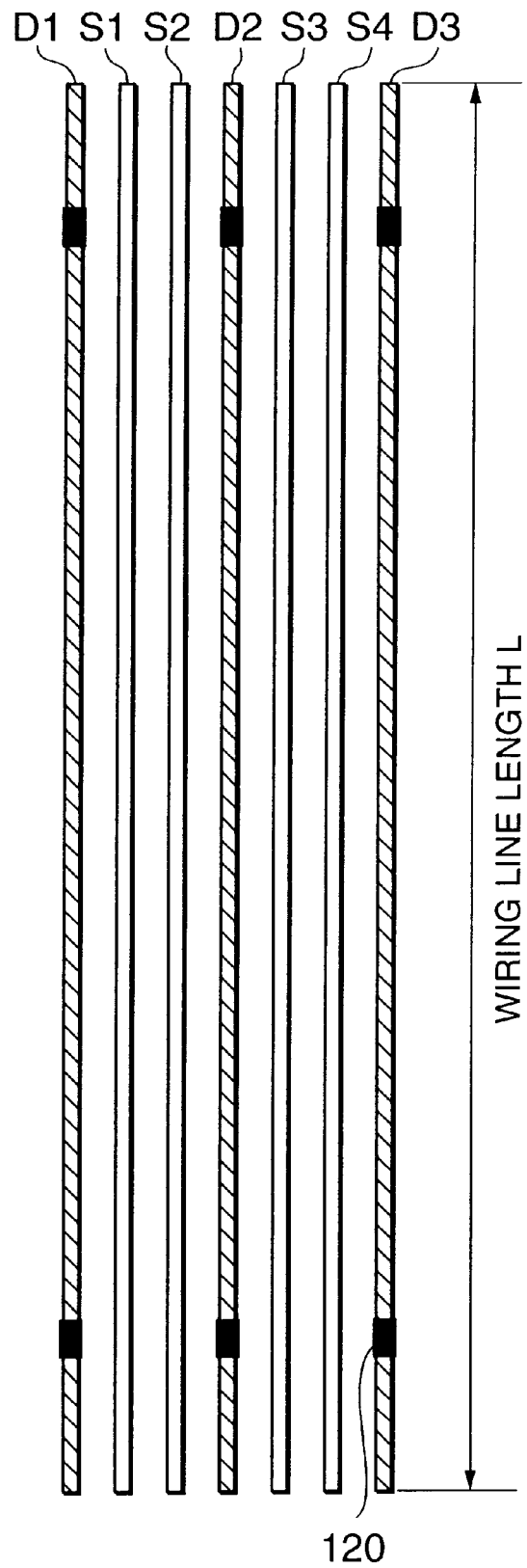
FIG. 9 is a diagram of a modified layout of Embodiment 1.

FIG. 9 is a diagram of a modified layout of Embodiment 1. Referring to this diagram, the GND potential is supplied to the shielding wires D1 to D3 via contacts (hereinafter referred to as "substrate contacts") 120 to the base plate (substrate).

Figure 17:
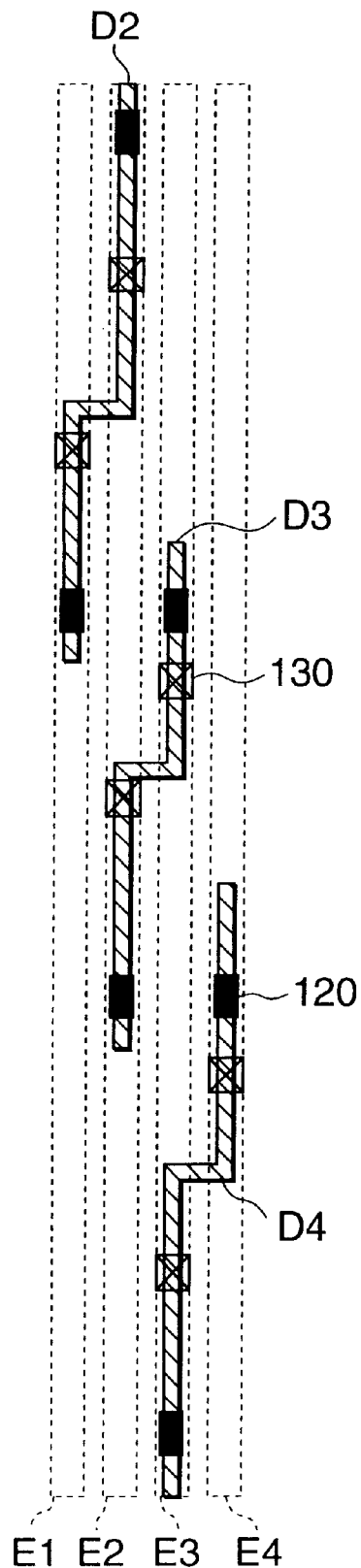
FIG. 17 is a diagram showing portions of the wiring layout shown in FIG. 16.

Embodiment 1 of the present invention and examples 1 and 2 of the background will be compared by using FIG. 9 and FIG. 17.

Figure 1:
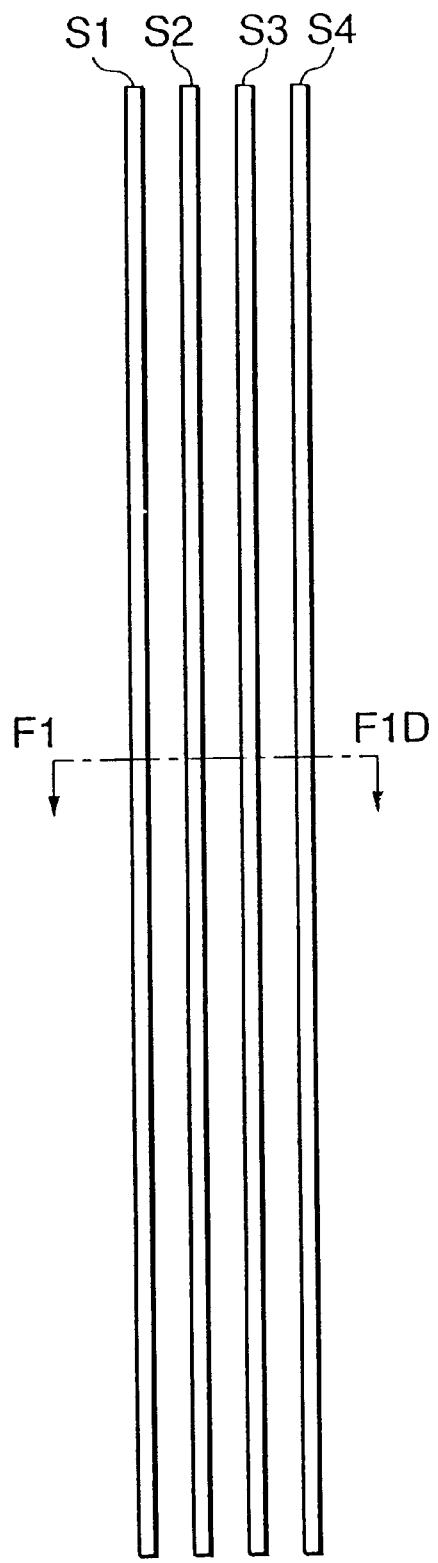
FIG. 1 is a wiring layout diagram of Example 1 of the background (using no anti-crosstalk measure).
Figure 2:
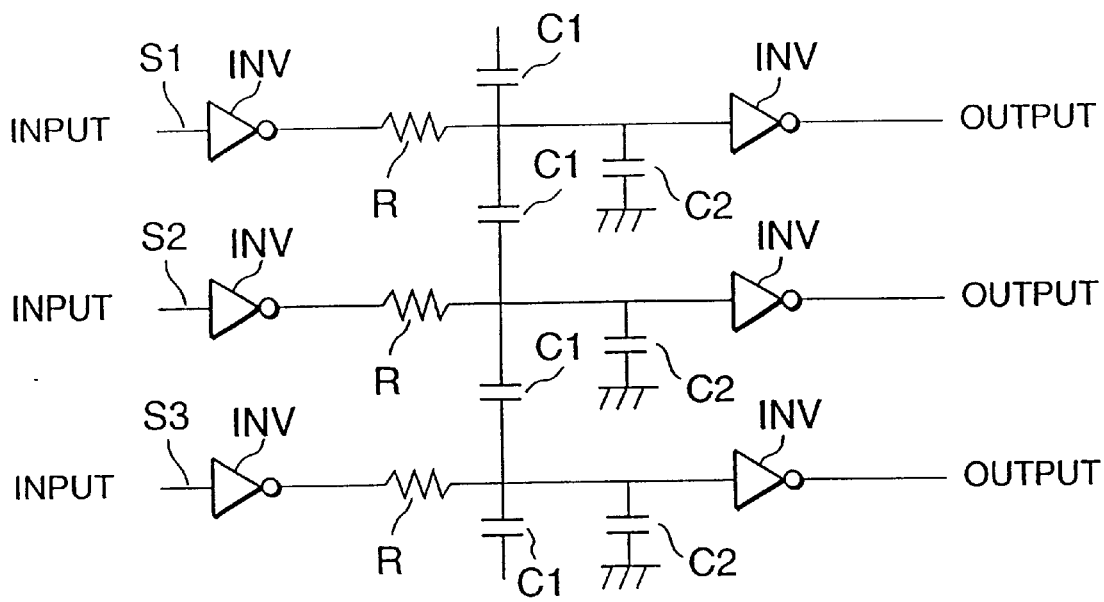
FIG. 2 is an equivalent circuit diagram of signal wires shown in FIG. 1.
Figure 3:
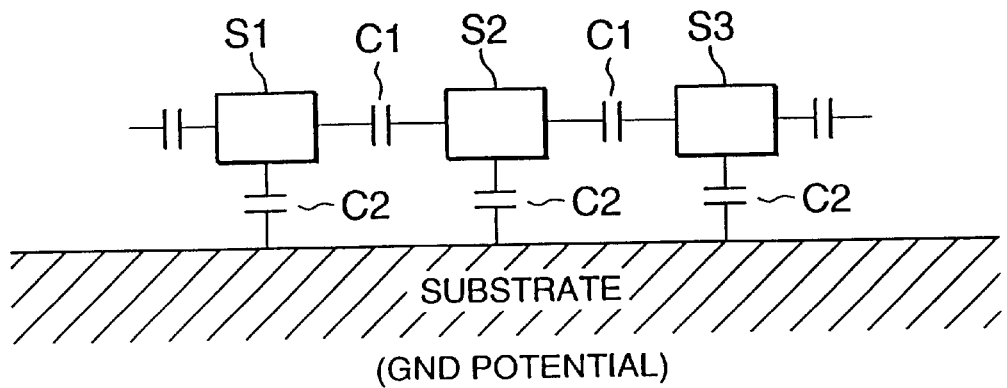
FIG. 3 is an F1–F1D cross-sectional view of the signal wires shown in FIG. 1.
Figure 4:
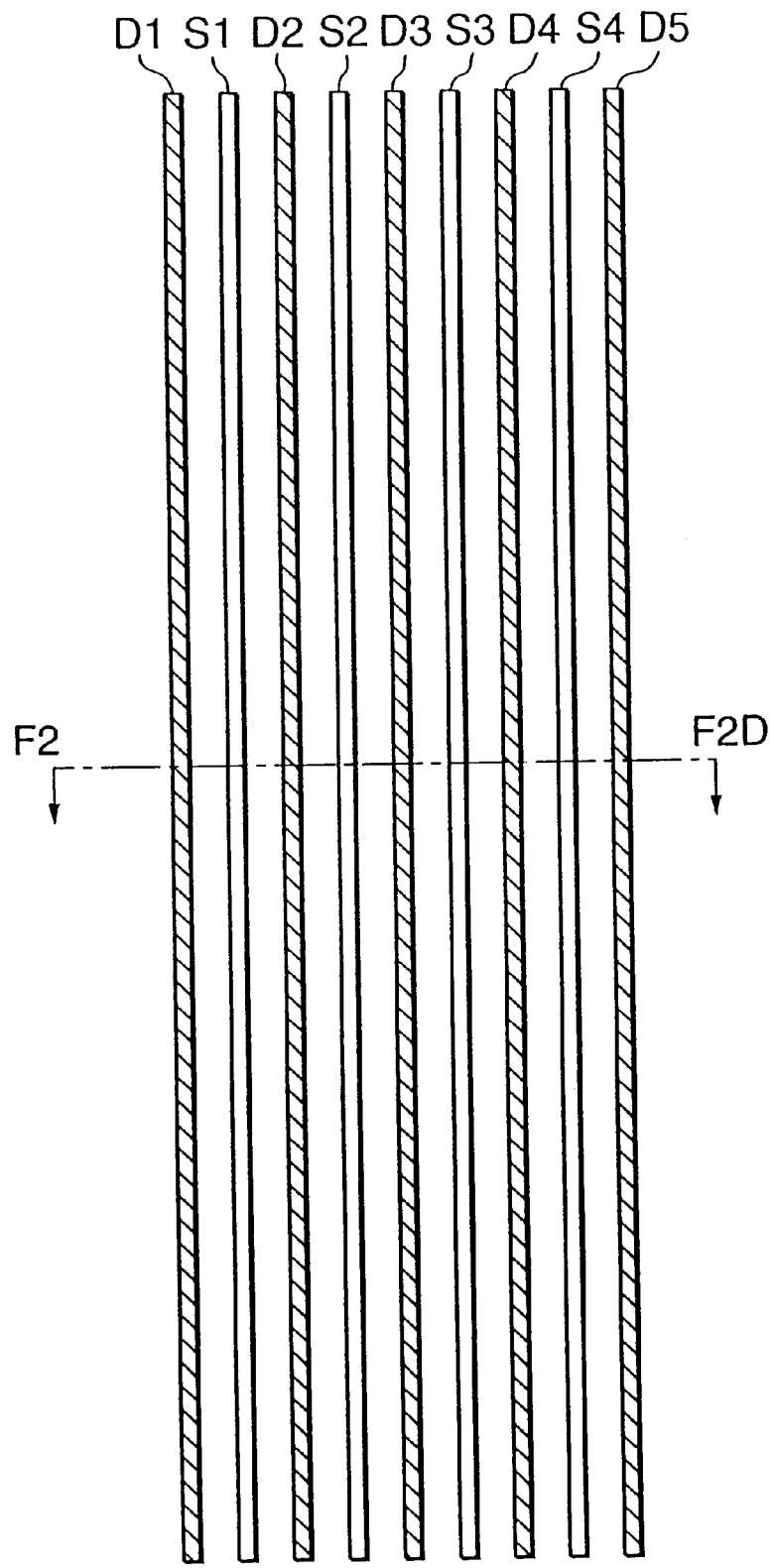
FIG. 4 is a wiring layout diagram of Example 2 of the background (using an anti-crosstalk measure).
Figure 5:
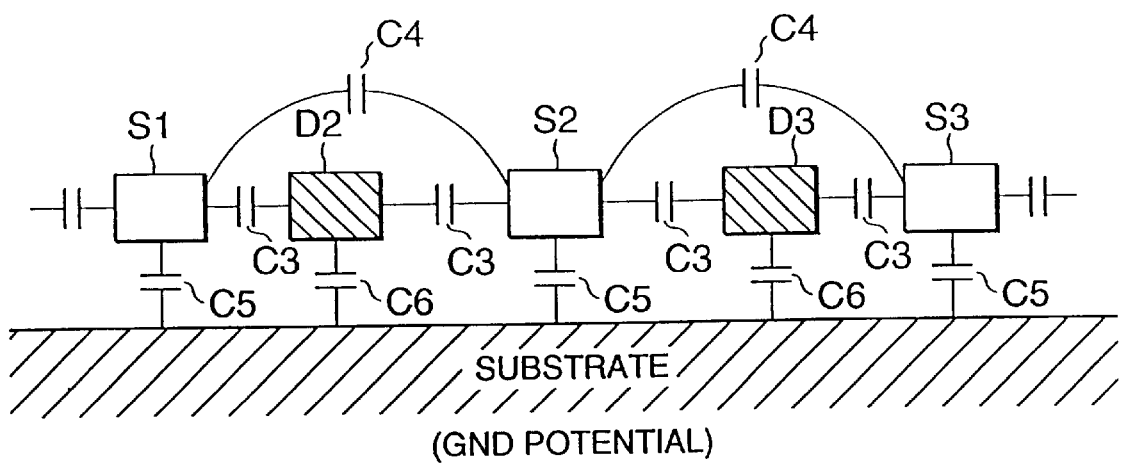
FIG. 5 is an F2–F2D cross-sectional view of the signal wires shown in FIG. 4.
Figure 6:
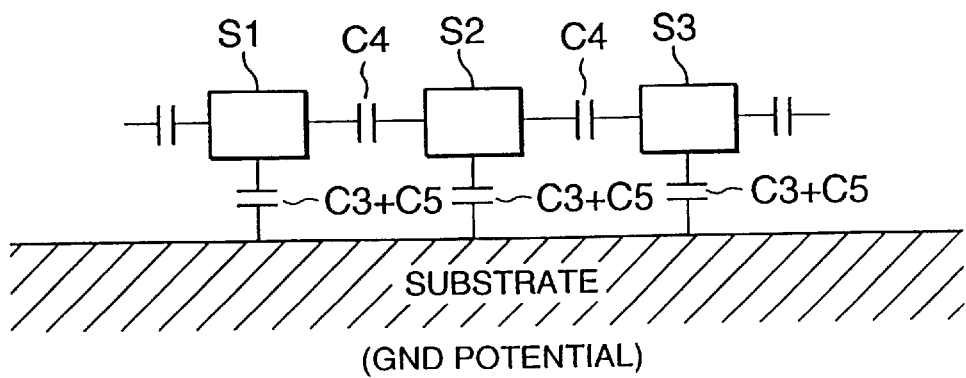
FIG. 6 is a diagram formed by simplifying FIG. 5.
Figure 10:
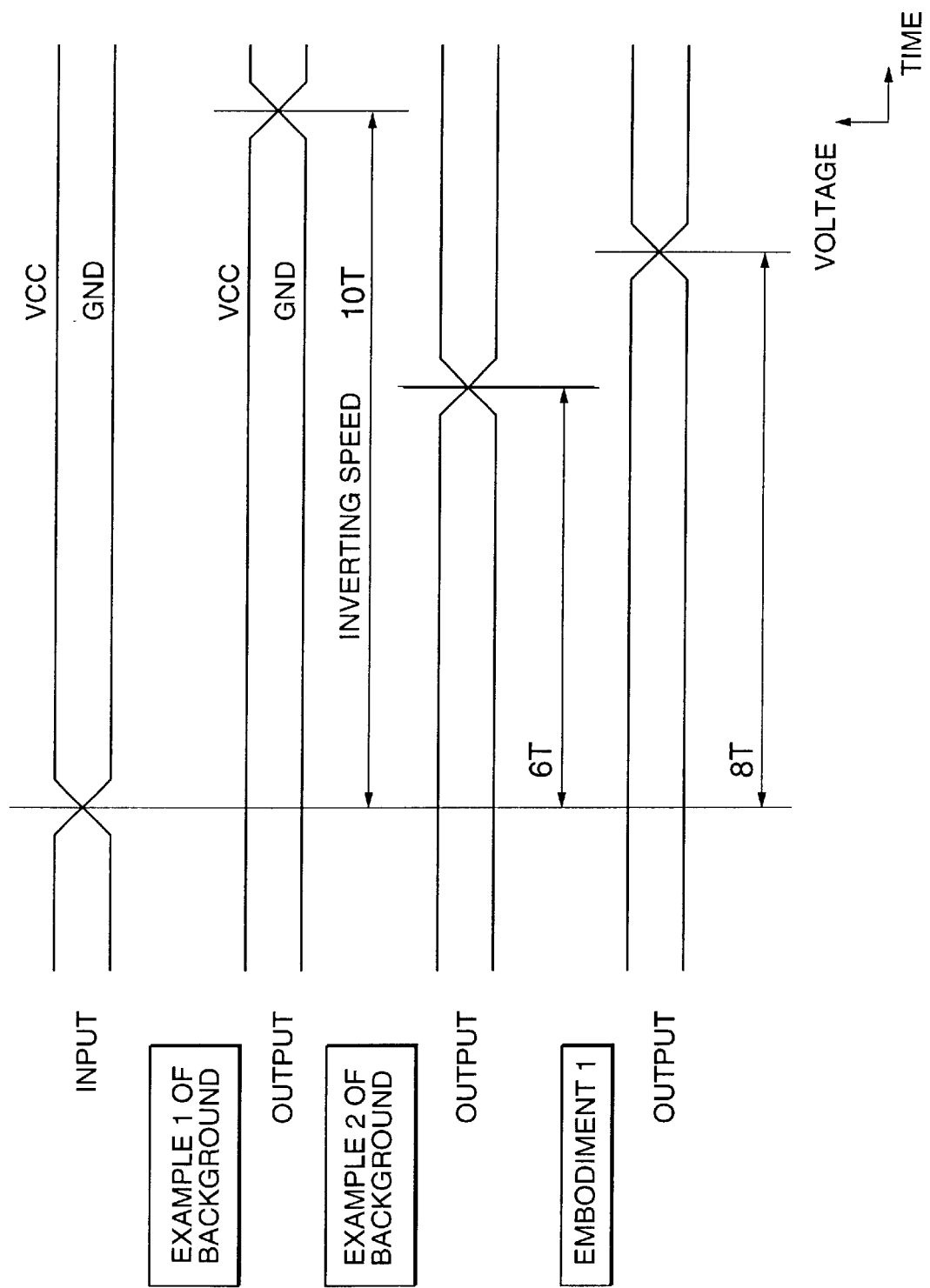
FIG. 10 is a graph showing voltage-time characteristics and a comparison between Embodiment 1 of the invention and Examples 1 and 2 of the background.

FIG. 10 shows voltage-time characteristics. Inputs and outputs in FIG. 10 are inputs to and outputs from the signal wires, e.g., the signal wires S2, and correspond to the input and output in the signal wire equivalent circuit diagram shown in FIG. 2.

Figure 7:
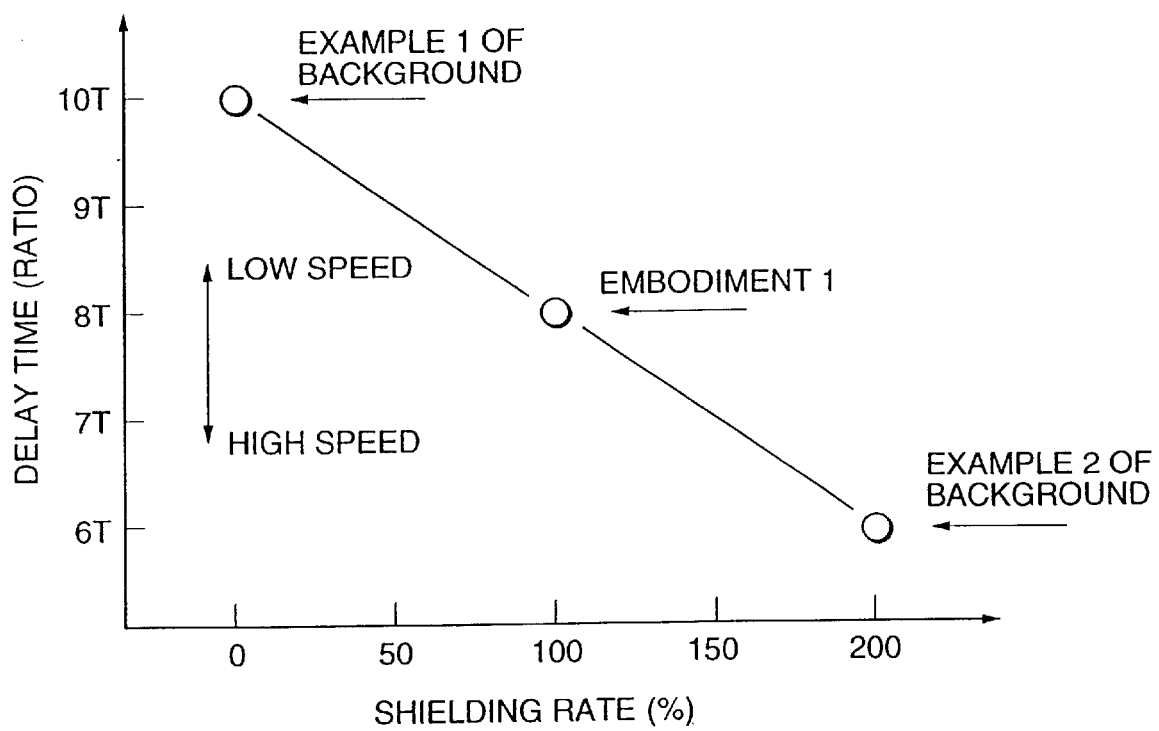
FIG. 7 is a graph showing a delay time-shielding rate dependence.

As can be understood from FIG. 10 and FIG. 7, the shielding rate in Embodiment 1 of the present invention is an intermediate value between those in Example 1 and Example 2 of the background. Also, in Embodiment 1 of the present invention, an inverting speed (delay time) is obtained as an intermediate value between those in Example 1 and Example 2 of the background.

(Embodiment 2)

Figure 11:
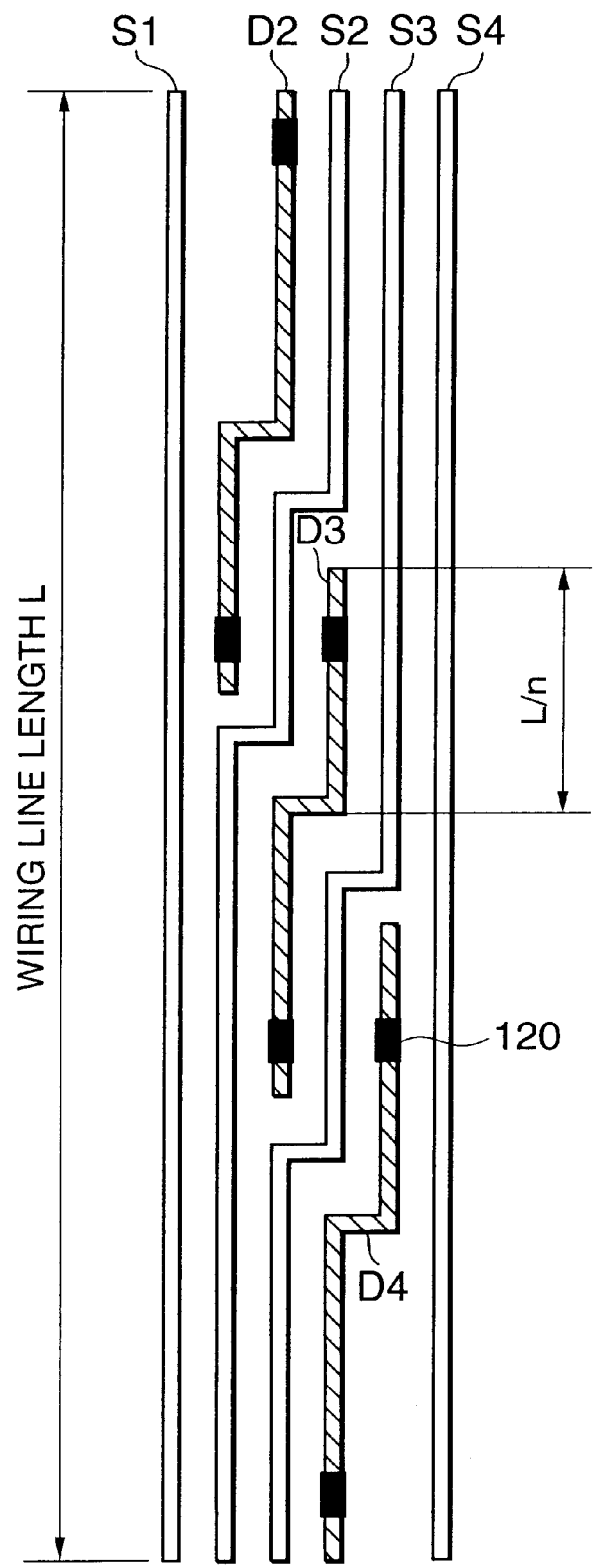
FIG. 11 is a wiring layout diagram of a semiconductor integrated circuit in Embodiment 2 of the present invention.

FIG. 11 is a wiring layout diagram of a semiconductor integrated circuit in Embodiment 2 of the present invention. For ease of description, a shielding method will be described with respect to signal wires S2 and S3 in signals wires S1 to S4 shown in FIG. 11.

An aluminum wiring is used as each of the signal wires S2 and S3 and shielding wires D2 to D4, shown in FIG. 11. However, this embodiment differs from Embodiment 1 of the present invention in the following two respects.

First, to control the shielding rate, some of the signal wires and the shielding wires are cranked (a wire in such a shape will be referred to as "cranked wiring conductor"). For example, as shown in FIG. 11, on the opposite sides of the signal wire S2, cranked two times, shielding wires D2 and D3 are provided, each of which is cranked one time by being patterned after the cranked portion of the signal wire S2. In this case, the signal wire S2 occupies an area large enough to cover three linear signal wires, and the shielding wires D2 and D3 are formed so as to be contained in this area. When another signal wire S3 is provided adjacent to the signal wire S2, a portion of the signal wire S3 is cranked so as to be contained in the wiring area occupied by the signal wire S2.

Second, to enable realization of cranked wiring conductors by a thin-film process using one aluminum layer, the GND potential for the shielding wires D2 to D4 is supplied via substrate contacts 120. This is because it is difficult to supply the GND potential to, for example, the shielding wire D3 formed as shown in FIG. 11 from a GND pad via an aluminum signal wire because of the small wiring spacing.

In this embodiment, the shielding wire length is expressed as 4L/n. With respect to, for example, the signal wire S2, this value is obtained by considering the existence of signal wire portions of the length L/n in four places in the shielding wires D2 and D3. For cranked wiring conductors, a wiring spacing in the direction of signal wire length (in the top-bottom direction in the figure) is required, such that the shielding wire length appears to be smaller than 4L/n. However, both the aluminum signal wire width and the wiring spacing are extremely small, 1 μm in contrast with the actual wire length 10 mm. Therefore, there is no problem with respect to specifying the shielding wire length by 4L/n.

The number of signal wires is represented by n, and the shielding rate varies according to n.

An approximate expression for the shielding rate of the signal wires S2 and S3 can be represented by the following equation from Equation (B):

$$\text{Shielding Rate} = (4L/n)/L \times 100 = 4/n \times 100. \quad \text{(Equation B-2)}$$

Since the area necessary for each shielding wires corresponds to two linear signal wires, an approximate expression for the wiring area can be represented by the following equation from Equation (C):

$$\text{Wiring Area} = n+2. \quad \text{(Equation C-2)}$$

When n=4 is substituted in Equation (C-2), the Wiring Area=6.

A cranked wiring conductor is illustrated in Japanese Patent No. 2921463. With respect to this example, however, no method of cranking a signal wire for the purpose of defining an area for shielding wire as in the present invention is disclosed; only an ordinary method of avoiding interference with any of circuits or signal wires is illustrated.

(Embodiment 3)

Figure 12:
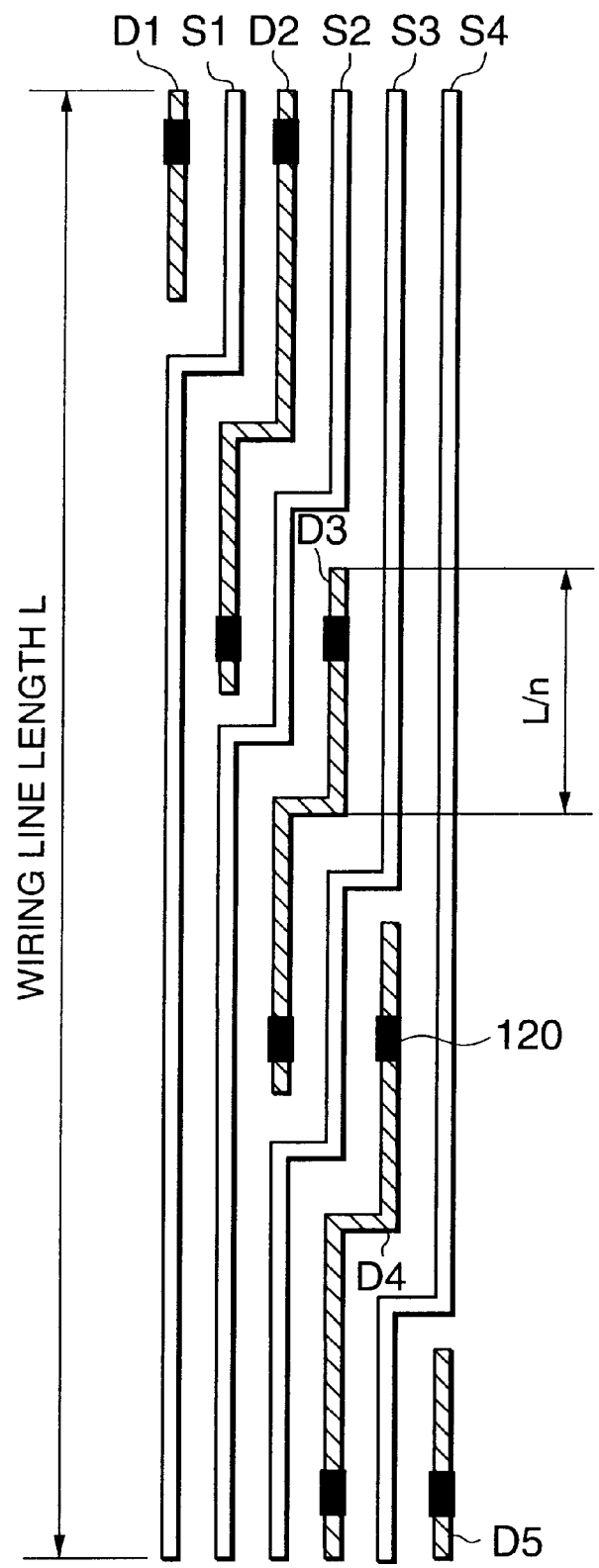
FIG. 12 is a wiring layout diagram of a semiconductor integrated circuit in Embodiment 3 of the present invention.

FIG. 12 is a wiring layout diagram of a semiconductor integrated circuit in Embodiment 3 of the present invention.

This embodiment is a modification of the above-described Embodiment 2 and has only a slight change from Embodiment 2 of the present invention. This embodiment is a layout method for improving the shielding effect of the outermost signal wires S1 and S4 shown in FIG. 13.

As shown in FIG. 12, signal wires S1 and S4 are formed by being patterned after the cranked shapes of shielding wires D2 and D4. In areas thereby defined, shielding wires D1 and D5 are formed.

In this embodiment, the shielding rate with respect to the signal wires S1 and S4 is improved in comparison with that in Embodiment 2. However, the wiring area is not increased. The shielding rate of the signal wires S2 and S3 is the same as that in Embodiment 2.

(Embodiment 4)

Figure 13:
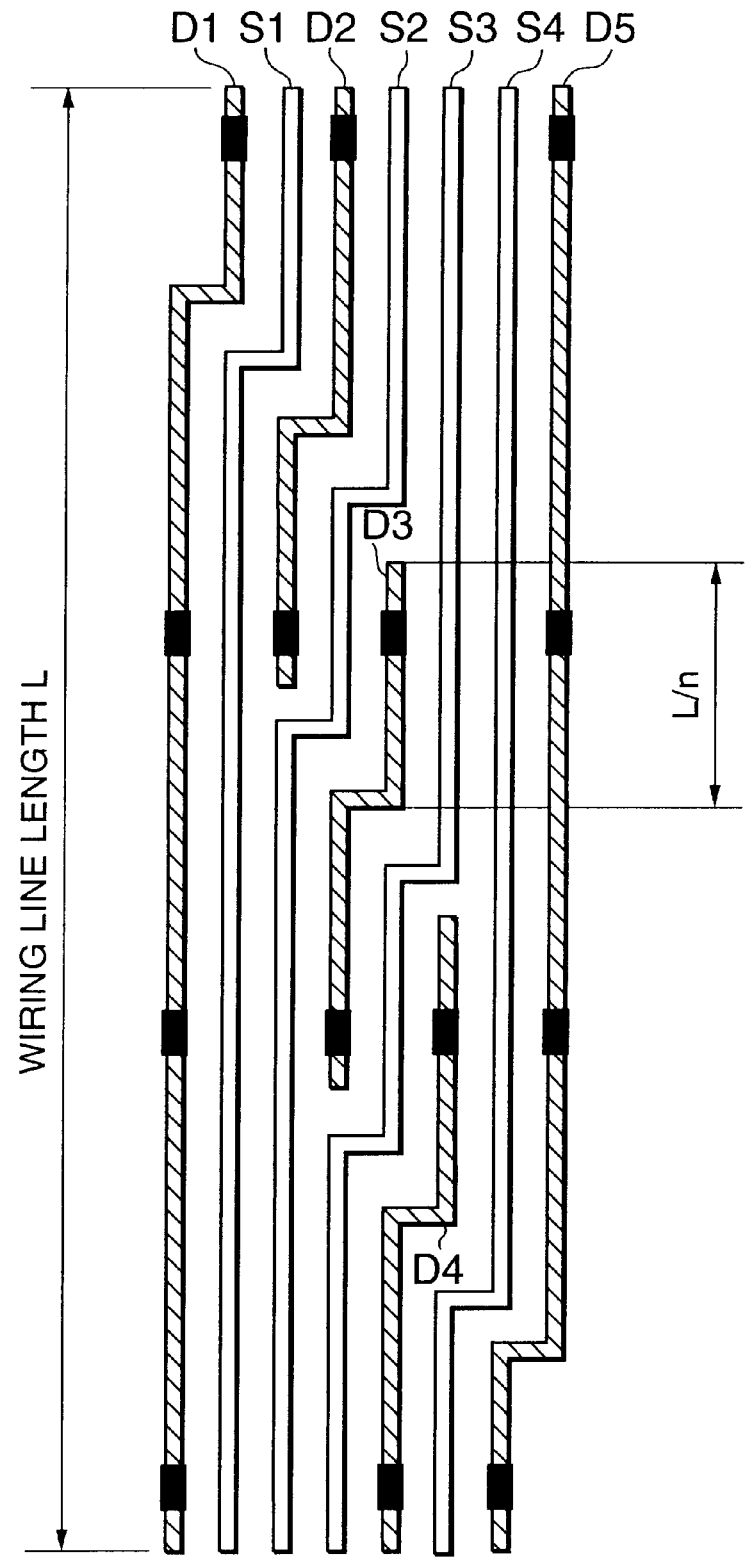
FIG. 13 is a wiring layout diagram of a semiconductor integrated circuit in Embodiment 4 of the present invention.

FIG. 13 is a wiring layout diagram of a semiconductor integrated circuit in Embodiment 4 of the present invention, showing a modification from Embodiment 3 of the present invention.

In this embodiment, shielding wires D1 and D5 in the above-described Embodiment 4 are formed along the entire lengths of the outermost signal wires S1 and S4, as shown in FIG. 13.

If wiring is performed in this manner, the shielding rate of the signal wires S1 and S4 is increased largely in comparison with Embodiment 3. However, the wiring area is also increased. The shielding rate of the signal wires S2 and S3 is the same as that in Embodiment 2.

In this embodiment, $$\text{Wiring area} = n+4. \quad \text{(Equation C-4)}$$

(Embodiment 5)

Figure 14:
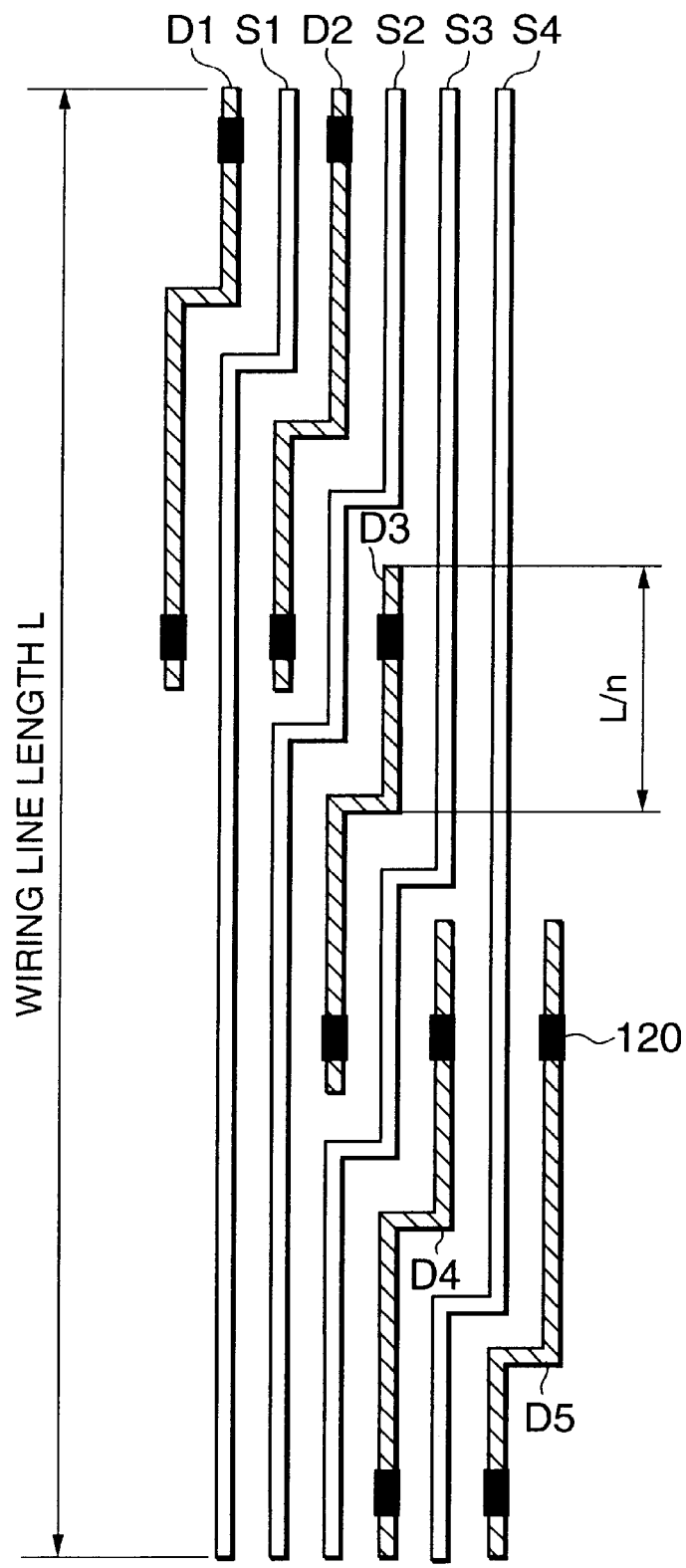
FIG. 14 is a wiring layout diagram of a semiconductor integrated circuit in Embodiment 5 of the present invention.

FIG. 14 is a wiring layout diagram of a semiconductor integrated circuit in Embodiment 5 of the present invention.

This embodiment is a method of making uniform the shielding rates of all signal wires. As shown in FIG. 14, on the opposite sides of a signal wire S1 (cranked one time), shielding wires D2 and D3 are provided, each of which is cranked one time, patterned after the cranked portion of the signal wire S1. Adjacent to the shielding wire D2 and the signal wire S1, a signal wire S2 is formed patterned after the cranked portion of the shielding wire D2. Also, in a space defined adjacent to the signal wire S2 by the cranked portion of the signal wire S2, a shielding wire D3 is formed by being patterned after the cranked portion of the signal wire S2.

Further, adjacent to the signal wire S2 and the shielding wire D3, a signal wire S3 is formed by being patterned after the cranked portion of the shielding wire D3. In a space defined adjacent to the signal wire S3 by the cranked portion of the signal wire S3, a shielding wire D4 is formed by being patterned after the cranked portion of the signal wire S3. Further, adjacent to the signal wire S3 and the shielding wire D4, a signal wire S4 is formed similar to the signal wire S3. Also, a shielding wire D5 is formed adjacent to the signal wire S4 in the same manner as the shielding wire D4.

In this embodiment, an approximate expression for the shielding rate of each of the signal wires S1 to S4 can be represented by the following equation based on the calculation method described above with respect to Embodiment 2:

$$\text{shielding rate}=4/n\times100(\%). \quad \text{(Equation B-5)}$$

Also, $$\text{Wiring Area}=n+4. \quad \text{(Equation C-5)}$$

(Embodiment 6)

Figure 15:
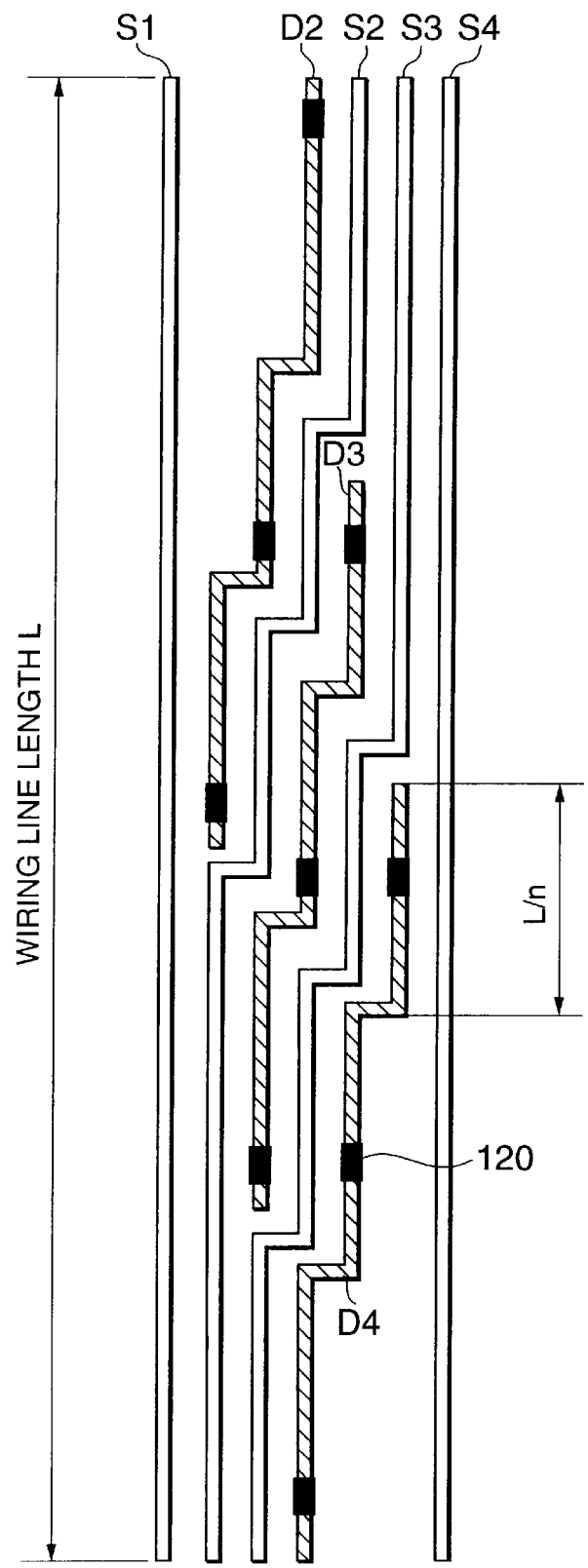
FIG. 15 is a wiring layout diagram of a semiconductor integrated circuit in Embodiment 6 of the present invention.

FIG. 15 is a wiring layout diagram of a semiconductor integrated circuit in Embodiment 6 of the present invention.

This embodiment is another modification of Embodiment 2. In Embodiment 2, the signal wire is bent two times for cranked wiring conductor and the shielding wire is bent one time. In this embodiment, each of the corresponding signal wire and shielding wire is bent one more time, as shown in FIG. 15.

In this embodiment, an approximate expression for the shielding rate of the signal wires S2 and S3 can be represented by the following equation based on the calculation method described above with respect to Embodiment 2:

$$\text{shielding rate}=(6L/n)/L\times100. \quad \text{(Equation B-6)}$$

$$\text{Wiring area}=n+3. \quad \text{(Equation C-6)}$$

In this embodiment, as described above, the shielding rate is increased although an increase in the wiring area also results.

(Embodiment 7)

Figure 16:
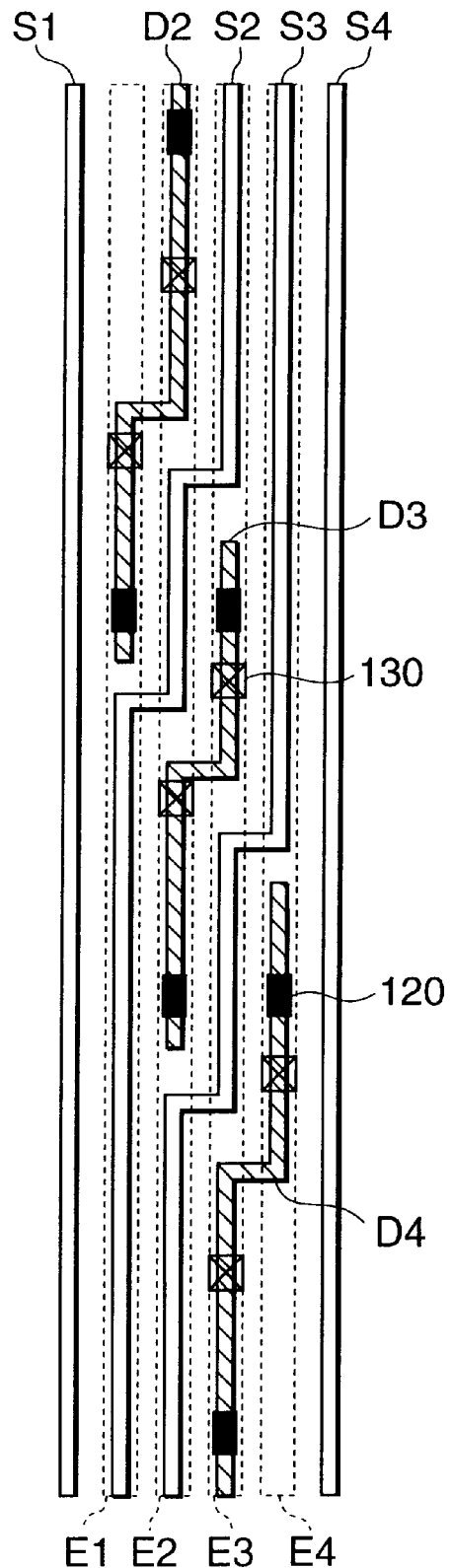
FIG. 16 is a wiring layout diagram of a semiconductor integrated circuit in Embodiment 7 of the present invention.

FIG. 16 is a wiring layout diagram of a semiconductor integrated circuit in Embodiment 7 of the present invention, and FIG. 17 is a diagram showing portions of the wiring layout shown in FIG. 16.

This embodiment is a modification based on a combination of first-layer aluminum signal wires in accordance with Embodiment 2 and second-layer aluminum signal wires. Referring to FIG. 16 and FIG. 17, in addition to the wiring layout of Embodiment 2 (see FIG. 11), shielding wires E1 to E4 made of aluminum in the second layer are formed in strips on the signal wires S2 and S3 made of aluminum in the first layer, in correspondence with the portions of the signal wires S2 and S3 in the direction of signal wire length (in the top-bottom direction as viewed in the figure). The shielding wires E1 to E4 are connected by through-hole contacts 130 to the first-layer shielding wires D2 to D4 to which the GND potential is supplied via the substrate contacts 120.

While the shielding wires E1 to E4 are shown in the form of strips in the figure, they may be short-circuited since they have the same potential. The second-layer shielding wires E1 to E4 are indicated by the dotted lines for distinction from the first-layer signal wires.

In this embodiment, an approximate expression for the shielding rate of the signal wires S2 and S3 can be represented by the following equation based on the calculation method described above with respect to Embodiment 2:

$$\text{shielding rate}=(L+4L/n)/L\times100. \quad \text{(Equation B-7)}$$

$$\text{wiring area}=n+2. \quad \text{(Equation C-7)}$$

In this embodiment, as described above, the shielding effect is increased in comparison with Embodiment 2.

Results of Comparison Between the Examples of the Background and the Embodiments of the Present Invention A comparison will be made between the examples of the background and the embodiments of the present invention.

FIG. 18 and FIG. 19 are tables of the total wiring area and the shielding rate for comparison between the examples of the conventional art and the embodiments of the present invention. As can be understood from the values of the shielding rate and the total wiring area of Embodiments 1, 2, and 6 shown in FIG. 19, these values are intermediate values between those of Example 1 and Example 2 or Example 2-2 of the background. Thus, the wiring methods in the embodiments of the present invention achieve a shielding effect while increasing the wiring area to a small extent, and thereby achieves a speedup effect of signal wire (i.e., a reduction in delay time in signal transmission).

According to the present invention, as described above, a shielding wire is formed on one of the opposite sides of each of a plurality of signal wires, the shielding wire having the same length as the signal wire and having the ground potential, or some of the signal wires is cranked and a shielding wire having the ground potential is formed in a space area defined by the cranked portion of the signal wire, thus making it possible to obtain a shielding effect of signal wires while increasing the wiring area to a small extent.

The present invention is not limited to the above embodiments, and it is contemplated that numerous modifications may be made without departing from the spirit and scope of the invention. The wiring structure, as described above with reference to the drawings, is a merely an exemplary embodiment of the invention, and the scope of the invention is not limited to these particular embodiments. Accordingly, other structural configurations may be used, without departing from the spirit and scope of the invention as defined in the following claims.

What is claimed is:

1. A semiconductor device comprising:
    a first signal wire having a first segment;
    a second signal wire having at least a first segment and a second segment, wherein the first segment of the second signal wire is parallel and adjacent to the first segment of the first signal wire, and the second segment of the second signal wire is connected to the first segment of the second signal wire by a first cranking point; and
    a first shielding wire having a first segment parallel and adjacent to the second segment of the second signal wire, and positioned between the first signal wire and the second segment of the second signal wire;

wherein the shielding wire is provided a predetermined voltage.

2. The semiconductor device of claim 1,
wherein the second signal wire further comprises a third segment connected to the second segment of the second wire by a second cranking point; and
the first shielding wire further comprises a second segment parallel and adjacent to the third segment of the second signal wire, and the second segment of the first shielding wire is connected to the first segment of the first shielding wire by a cranking point.

3. The semiconductor device of claim 2,
wherein the first signal wire further comprises a second segment connected to the first segment of the first signal wire by a first cranking point, and the second segment of the first signal wire is parallel and adjacent to the second segment of the first shielding wire; and
the second segment of the first shielding wire is positioned between the third segment of the second signal wire and the second segment of first signal wire.

4. The semiconductor device of claim 3,
wherein the first signal wire further comprises a third segment connected to the second segment of the first signal wire by a second cranking point; and
the third segment of the first signal wire is parallel and adjacent to the third segment of the second signal wire.

5. The semiconductor device of claim 3 further comprising:
a second shielding wire having a first segment parallel and adjacent to the second segment of the second signal wire, and
a third signal wire parallel and adjacent to both the first segment of the second shielding wire and the third segment of the second signal wire, such that the first segment of the second shielding wire is positioned between the third signal wire and the second segment of the second signal wire,
wherein the second shielding wire is provided a predetermined voltage.

6. The semiconductor device of claim 5,
wherein the second shielding wire further comprises a second segment parallel and adjacent to the first segment of the second signal wire, and the second segment of the second shielding wire is connected to the first segment of the second shielding wire by a cranking point, such that the second segment of the second shielding wire is positioned between the third signal wire and the first segment of the second signal wire.

7. The semiconductor device of claim 6,
wherein the predetermined voltage is a ground potential.

8. The semiconductor device of claim 6,
an insulating layer covering the first signal wire, the second signal wire, the first shielding wire and the second shielding wire;
a first hole in the insulating layer on the first shielding wire; and
a first upper-layer shielding wire on a top of the insulating layer and connected to the first shielding wire through the first hole.

9. The semiconductor device of claim 8, further comprising:
a second hole in the insulating layer on the second shielding wire; and
a second upper-layer shielding wire on the insulating layer and connected to the second shielding wire through the second hole.

10. A semiconductor device comprising:
a first signal wire having a first segment;
a second signal wire having a first segment and a second segment, wherein the first segment is connected to the second segment by a cranking point, and the second signal wire is parallel to the first signal wire;
a first shielding wire having a first segment positioned parallel and adjacent to both the first segment of the first signal wire and the second segment of the second signal wire, such that the first shielding wire is positioned between the first segment of the first signal wire and the second segment of the second signal wire; and
a second shielding wire parallel and adjacent to the first segment of the second signal wire,
wherein the first shielding wire and the second shielding wire are provided a predetermined voltage.

11. The semiconductor device of claim 10,
wherein the second shielding wire further comprises a second segment parallel and adjacent to the second segment of the second signal wire, such that the second segment of the second signal wire is positioned in between the second segment of the second shielding wire and the first segment of the first shielding wire,
wherein the first segment of the second shielding wire is connected to the second segment of the second shielding wire by a cranking point.

12. The semiconductor device of claim 11,
wherein the second segment of the second shielding wire and the second segment of the second signal wire are substantially the same length.

13. The semiconductor device of claim 11,
wherein the second segment of the second shielding wire and the first segment of the first shielding wire are substantially the same length.

14. The semiconductor device of claim 13,
wherein the first signal wire further comprises a second segment parallel and adjacent to the second segment of the second signal wire, and the second segment of the first signal wire is connected to the first segment of the first signal wire by a cranking point.

15. The semiconductor device of claim 14,
wherein the predetermined voltage is a ground potential.

16. The semiconductor device of claim 14,
an insulating layer covering the first signal wire, the second signal wire, the first shielding wire and the second shielding wire;
a first hole in the insulating layer on the first shielding wire; and
a first upper-layer shielding wire on a top of the insulating layer and connected to the first shielding wire through the first hole.

17. The semiconductor device of claim 14, further comprising:
a second hole in the insulating layer on the second shielding wire; and
a second upper-layer shielding wire on the insulating layer and connected to the second shielding wire through the second hole.

18. A semiconductor device comprising:
a first signal wire having first, second, third, and fourth segments, each segment connected to the next by a cranking point;
a second signal wire having first, second, third, and fourth segments, each segment connected to the next by a cranking point;

a first shielding wire having first, second and third segments, each segment connected to the next by a cranking point;

a second shielding wire having first, second and third segments, each segment connected to the next by a cranking point; and a third shielding wire having first, second and third segments, each segment connected to the next by a cranking point, wherein the second and third segments of the second signal wire are positioned between the second and third segments of the third shielding wire, respectively, on one side, and the first and second segments of the second shielding wire, respectively, on the other side, wherein the second and third segments of the first signal wire and positioned between the second and third segments of the second shielding wire, respectively, on the side, and the first and second segments of the first shielding wire, respectively, on the other side, and wherein the first segments of the first signal wire is parallel and adjacent to the first segments of the second signal wire, and the fourth segments of the first signal wire is parallel and adjacent to the fourth segment of the second signal wire.

19. The semiconductor device as claimed in claim 18, further comprising:

an insulating layer covering the first signal wire, the second signal wire, the first shielding wire and the second shielding wire;

a first via hole in the insulating layer on the first shielding wire;

a second hole in the insulating layer on the second shielding wire;

a first upper-layer shielding layer on the insulating layer and connected to the first shielding wire through the first hole; and a second upper-layer shielding layer on the insulating layer and connected to the second shielding wire through the second hole.

20. A semiconductor device comprising, a first shielding wire;

a first signal wire adjacent to the first shielding wire;

a second signal wire adjacent to the first signal wire;

a second shielding wire adjacent to the second signal wire; and a third signal wire adjacent to the second shielding wire;

wherein the first shielding wire and the second shielding wire are provided a predetermined potential.

* * * * *